United States Patent [19]

Mori et al.

[11] Patent Number: 5,766,494
[45] Date of Patent: Jun. 16, 1998

[54] ETCHING METHOD AND APPARATUS

[75] Inventors: Haruki Mori, Yokosuka; Yukimasa Yoshida, Yokohama, both of Japan; Koji Shimomura, Sunnyvale, Calif.

[73] Assignee: Kabushiki Kaisha Toshiba, Kawasaki, Japan

[21] Appl. No.: 520,109

[22] Filed: Aug. 28, 1995

[30] Foreign Application Priority Data

Aug. 29, 1994 [JP] Japan ................................. 6-203956

[51] Int. Cl.$^6$ ............................................... B44C 1/22
[52] U.S. Cl. ............................... 216/45; 216/69; 216/71
[58] Field of Search .............................. 156/345, 643.1, 156/662.1; 216/45, 68, 69, 71

[56] References Cited

U.S. PATENT DOCUMENTS

| | | | |
|---|---|---|---|
| 4,612,432 | 9/1986 | Sharp-Geisler | 156/345 |
| 5,290,382 | 3/1994 | Zarowin et al. | 156/345 |
| 5,292,400 | 3/1994 | Mumola | 156/345 |
| 5,298,103 | 3/1994 | Steinberg et al. | 156/345 |
| 5,445,709 | 8/1995 | Kojima et al. | 156/345 |
| 5,539,609 | 7/1996 | Collins et al. | 361/234 |

FOREIGN PATENT DOCUMENTS

| | | |
|---|---|---|
| 03237715 | 10/1991 | Japan . |
| 04073936 | 3/1992 | Japan . |

Primary Examiner—R. Bruce Breneman
Assistant Examiner—George Goudreau
Attorney, Agent, or Firm—Finnegan, Henderson, Farabow, Garrett & Dunner, L.L.P.

[57] ABSTRACT

According to the present invention, there is provided an etching method comprising the steps of forming a first thin film on a surface of a substrate to be processed, supporting the substrate to be processed, forming a second thin film serving to deactivate an active gas used for etching the first thin film, on a surface of a mask plate piece used as the first thin film mask, fixing the mask plate piece so that the first thin film and the second thin film oppose to each other with a predetermined distance therebetween, and etching the first thin film by supplying the active gas to the first thin film via the mask plate piece.

8 Claims, 3 Drawing Sheets

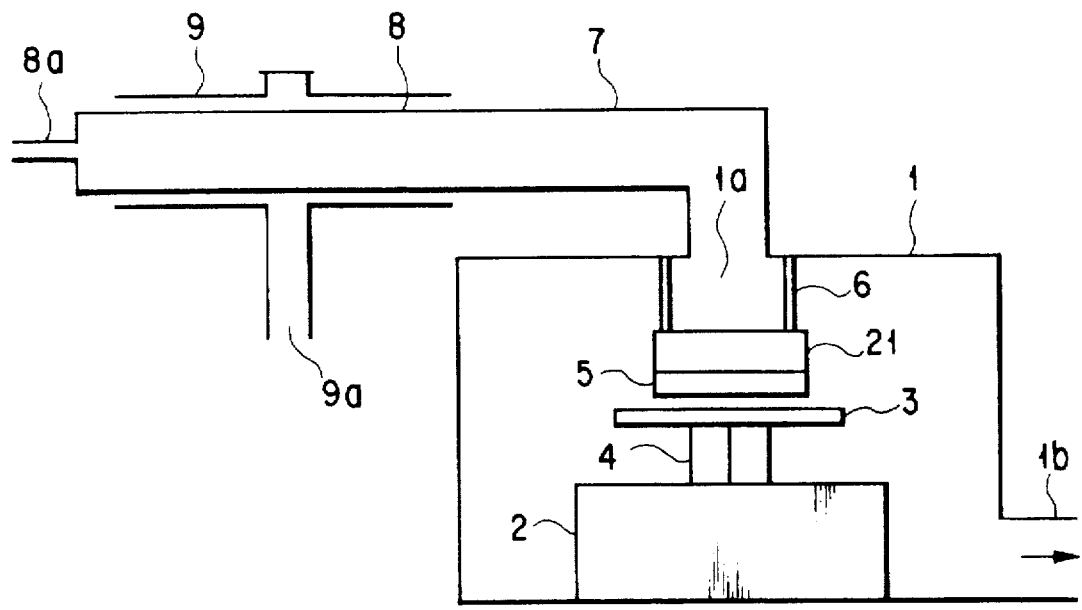
F I G. 5
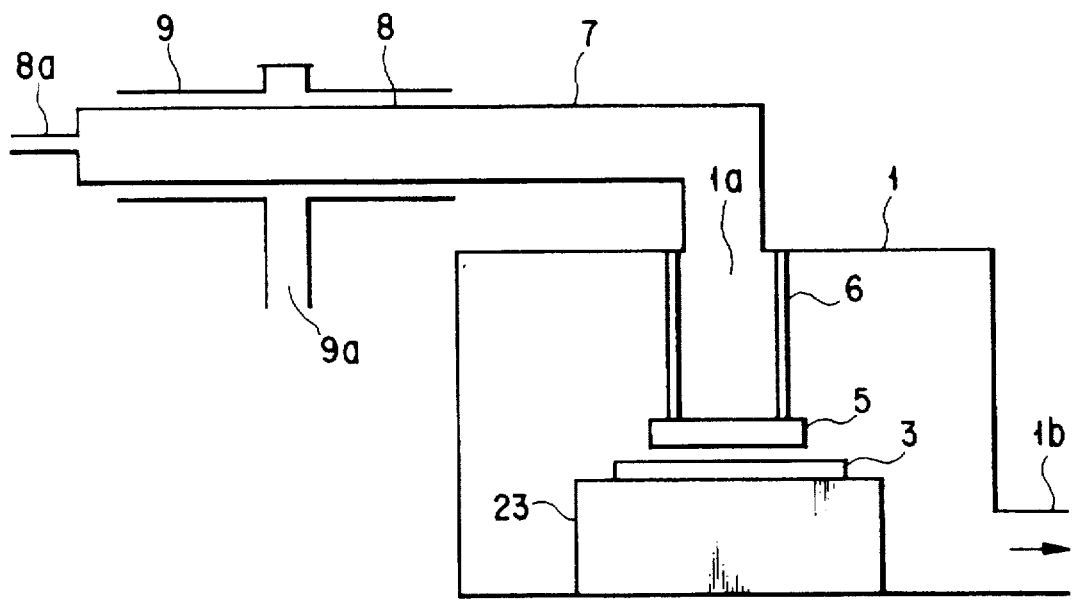
F I G. 6

ETCHING METHOD AND APPARATUS

BACKGROUND OF THE INVENTION

1. Field of the Invention

The present invention relates to a method of etching a thin film and an apparatus therefor, used in a process of manufacturing a semiconductor element or the like, and more specifically, an etching method of processing a polycrystal silicon thin film or a silicon nitride thin film formed on a semiconductor wafer, into a desired shape, and an apparatus used therefor.

2. Description of the Related Art

In the manufacturing process of a semiconductor element or the like, a step of forming a thin film (polycrystal silicon or silicon nitride film or the like) on a semiconductor wafer, and a step of removing, by etching, an unnecessary portion of the thin film with use of a mask, so as to make a desired pattern, are alternately carried out.

In the case where a very fine processing required to make a desired pattern having a width of about $10^{-6}$ to $10^{-7}$ should be carried out, a photoresist which is a photosensitive organic thin film is processed by a photolithograph method into a mask, and the unnecessary portion is etched with use of the mask.

In the case of a fine process in which the width of a desired pattern is about $10^{-3}$ m (for example, the case where a film formed on the rear surface side or the end surface portion of a semiconductor wafer, should be removed), if the etching technique is used with use of a photoresist as a mask as described above, it takes a great number of steps, a large amount of time, and a high cost, which creates a problem.

It is considered as a simple masking method in which no photoresist is used, that a mask plate piece having a desired pattern shape is placed on a semiconductor wafer in contact therewith, and a dry etching is carried out with use of the mask plate as a mask. With this method, although the time and cost can be reduced, the surface of the semiconductor wafer is scratched or dust is adhered on the surface, creating a different problem.

In the case of a method of etching a thin film, which is carried out in the state where the mask plate piece is placed close to the surface of the wafer, the surface of the wafer is not scratched or damaged; however the shape of the pattern side surface portion formed directly underneath the edge portion of the mask plate piece by the etching, is greatly different from what is ideal, creating still a different problem.

More specifically, it is preferable that the pattern side surface portion formed directly underneath the edge portion of the mask plate piece by the etching should be made normal to the surface of the wafer. However, the active gas which has passed the mask plate piece not only enters and proceeds straight toward the thin film but also moves around the edge portion of the mask plate piece. In this case, from the lower portion of the thin film (the wafer surface side) towards the upper portion (the mask plate piece side), the degree of excessive etching is increased. As a result, the pattern side surface portion obtained after the etching, has a shape which is sloped towards its thickness direction. Particularly, at the upper portion of the thin film, an excessive etching is carried out from the portion underneath the edge portion of the mask plate piece in the horizontal direction by several millimeters.

Such a shape of the pattern side surface portion formed to have a slope, is a factor of deteriorating the quality of a semiconductor or the like, which is the final product.

SUMMARY OF THE INVENTION

The object of the present invention is to provide an etching method and an etching apparatus, by which the shape of a pattern side surface portion formed directly underneath the edge portion of a mask plate piece is made closer to what is ideal, in the case where the thin film is etched while the mask plate piece being situated close to the surface of the wafer.

According to an aspect of the present invention, there is provided an etching method comprising the steps of: forming a first thin film on a surface of substrate to be processed; supporting the substrate to be processed; forming a second thin film serving to deactivate an active gas used for etching the first thin film, on a surface of a mask plate piece used as the first thin film mask; fixing the mask plate piece so that the first thin film and the second thin film oppose to each other with a predetermined distance therebetween; and etching the first thin film by supplying the active gas to the first thin film via the mask plate piece.

With this method, the density of the active gas which enters as proceeding around the edge portion of the mask plate piece is significantly decreased, the pattern side surface portion formed by the etching can be shaped into what is ideal.

According to another aspect of the present invention, there is provided an etching method comprising the steps of: forming a first thin film on a surface of a substrate to be processed; supporting the substrate to be processed; straightening a warp of the substrate by statically chucking the substrate using a susceptor; forming a second thin film serving to deactivate an active gas used for etching the first thin film, on a surface of a mask plate piece used as the first thin film mask; fixing the mask plate piece so that the first thin film and the second thin film oppose to each other with a predetermined distance therebetween; and etching the first thin film by supplying the active gas to the first thin film via the mask plate piece.

With this method, the mask plate piece can be situated closer to the substrate to be processed, and therefore the shape of the pattern side surface portion formed by etching can be made closer to the ideal form.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 5 is a diagram showing the structure of an etching apparatus according to the second embodiment; and FIG. 6 is a diagram showing the structure of an etching apparatus according to the third embodiment.

DETAILED DESCRIPTION OF THE PREFERRED EMBODIMENTS

Embodiments of the present invention will now be described with reference to accompanying drawings.
(First Embodiment)

Figure 1:
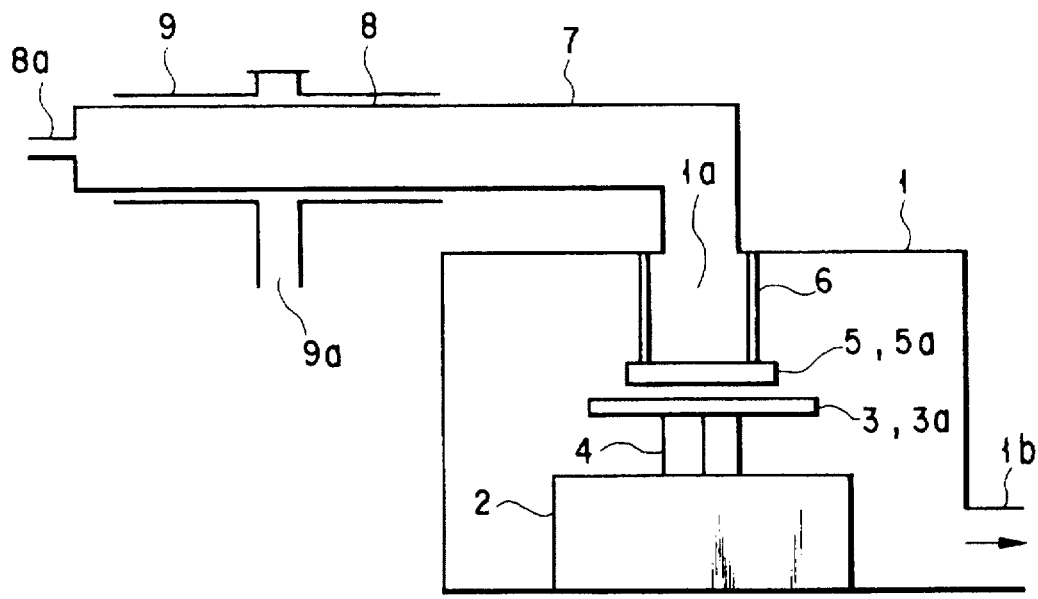
FIG. 1 is a diagram showing the structure of an etching apparatus according to the first embodiment.

FIG. 1 is a diagram showing the structure of an etching apparatus according to the first embodiment.

A reaction vessel 1 has a gas introduction opening 1a for introducing an active gas into the vessel and a gas exhaustion opening 1b for exhausting a gas or the like produced by a reaction by means of an exhaustion pump (not shown). The reaction vessel 1 has a supporting stage 2 inside, on which a supporting rod 4 for supporting a circular silicon wafer 3 (substrate to be processed) is provided. In the upper portion of the supporting rod 4, a fixing rod 6 for fixing a circular mask plate piece 5 is provided. The supporting rod 4 is designed to be able to adjust the distance between the mask plate piece 5 and the to-be-processed substrate 3 to 10 μm to 100 μm.

One end of a transport pipe 7 is connected to the gas introduction opening 1a, and the other end of the transport pipe 7 is connected to one end of a quartz discharge tube 8. A microwave applicator 9 is provided on the outer side of the quartz discharge tube 8 so as to cover the tube 8, and the microwave applicator 9 has a microwave introduction opening 9a for introducing a microwave from a microwave power source (not shown). A gas supply opening 8a is connected to the other end of the quartz discharge tube 8.

Next, the etching method according to the first embodiment of the present invention will now be described with reference to FIG. 1.

A thermal oxide film (not shown) having a thickness of 100 nm is formed on the surface of the substrate 3, and a polycrystal silicon film (not shown) having a thickness of 400 nm is deposited on the thermal oxide film by a CVD (chemical vapor deposition) method. Then, the substrate 3 is placed on the supporting rod 4 so that the surface on which the polycrystal silicon film is deposited, faces upward.

In the meantime, a thermal oxide film (not shown) having a thickness of 800 nm is formed on the surface of the mask plate piece 5, and a polycrystal silicon film (not shown) having a thickness of 400 nm is deposited on the thermal oxide film by the CVD method. The mask plate piece 5 is fixed by a fixing rod 6 so that the polycrystal silicon film deposited on the surface of the piece 5 opposes to the polycrystal silicon film deposited on the surface of the substrate 3. It should be noted that the diameter of the mask plate piece 5 thus fixed is 6 mm smaller than the diameter of the substrate 3 to be processed.

When fixing the mask plate piece 5, the piece 5 is adjusted so that the center is situated above the center of the substrate 3. With this adjustment, the inner portion of the substrate 3 other than the outermost periphery having a width of 3 mm is masked by the mask plate piece 5. Further, as the supporting rod 4 moves up and down, the distance between the mask plate piece 5 and the substrate 3 is adjusted to be a predetermined value in a range of 10 μm to 100 μm. As long as the polycrystal silicon film on the mask plate piece 5 and the polycrystal silicon film of the substrate 3 are not brought into contact with each other, the mask plate piece 5 and the substrate 3 should preferably be made as close to each other as possible. This is because as the mask plate piece 5 and the substrate 3 are closer to each other, the shape of the pattern side surface portion formed by etching can be made closer to the ideal shape. The reason for limiting the distance to 100 μm or less is that it becomes difficult to make the shape of the pattern side surface portion after etching close to the ideal shape if the distance exceeds 100 μm.

Next, a mixture gas of $CF_4$, a flow rate of which is adjusted to 150 sccm, and $O_2$, a flow rate of which is adjusted to 60 sccm, is supplied into the quartz discharge tube 8 via the gas supplying opening 8a. After that, a microwave having an output power of 700 W and a frequency of 2.45 GHz is supplied by the microwave power source from the microwave introduction opening 9a of the microwave applicator 9 to the quartz discharge tube 8. Thus, in the quartz discharge tube 8, a discharge is induced, and an active gas (not shown) containing excited fluorine elements (fluorine radicals) is generated.

Then, the active gas is supplied from the gas introduction opening 1a into the reaction vessel 1 via the transport tube 7.

In the reaction vessel 1, the substrate 3 masked by the mask plate piece 5 is subjected to etching by the active gas for 2.2 minutes. The portion of the polycrystal silicon film on the surface of the substrate 3, which corresponds to the outermost periphery portion having a width of 3 mm, is etched, and thus the inner portion of the polycrystal silicon film which is on the surface of the substrate 3 remains. It should be noted that the portion of the polycrystal silicon film, which is the outermost circumferential portion having a width of 3 mm should be completely removed. The pressure in the reaction vessel 1 during the etching is set at 40Pa by adjusting the conductance of the exhaustion system. After that, the gas generated by the reaction and the unreacted gas are exhausted from the exhaustion opening 1b by an exhaustion pump.

The etching time is set to 2.2 minutes on the basis of the results of the below-described preliminary experiment. In the preliminary experiment, the portion of the polycrystal silicon film, which corresponds to the outermost 3 mm-periphery of the substrate, was etched under the same condition as of the above etching. The etching rate was measured to be about 200 nm/min. The thickness of the polycrystal silicon film was 400 nm. In this case, the etching time can be obtained from the following formula equation (1):

(Etching time) = (Thickness of polycrystal silicon film) × (Coefficient)/(Etching rate)    (1)

= 400 nm × 1.1/200 nm/min

= 2.2 min.

The above coefficient indicates the degree of the undulation of the polycrystal silicon (wafer) in terms of thickness. The reason for setting the coefficient to 1.1 is that the polycrystal silicon film is not uniform in thickness and it is expected that the configuration thereof has up-and-down portions of about 10% from one place to another.

Next, in order to examine how the shape of the pattern side surface portion (polycrystal silicon film on the substrate to be processed) formed by etching in the present invention is different from that of the prior art technique, the following experiment was carried out. In this experiment, a conventional mask plate piece 5a was used in place of the mask plate piece 5 used in the present invention. As in the case of the present invention, a thermal oxide film (not shown) having a thickness of 800 nm was formed on the surface of the mask plate piece 5a; however a polycrystal silicon film (not shown) is not deposited on the thermal oxide film. It should be noted that a conventional substrate 3a to be processed was the same as the substrate 3 used in the present invention. Further, the other elements were the same as those used in the present invention.

Figure 2:
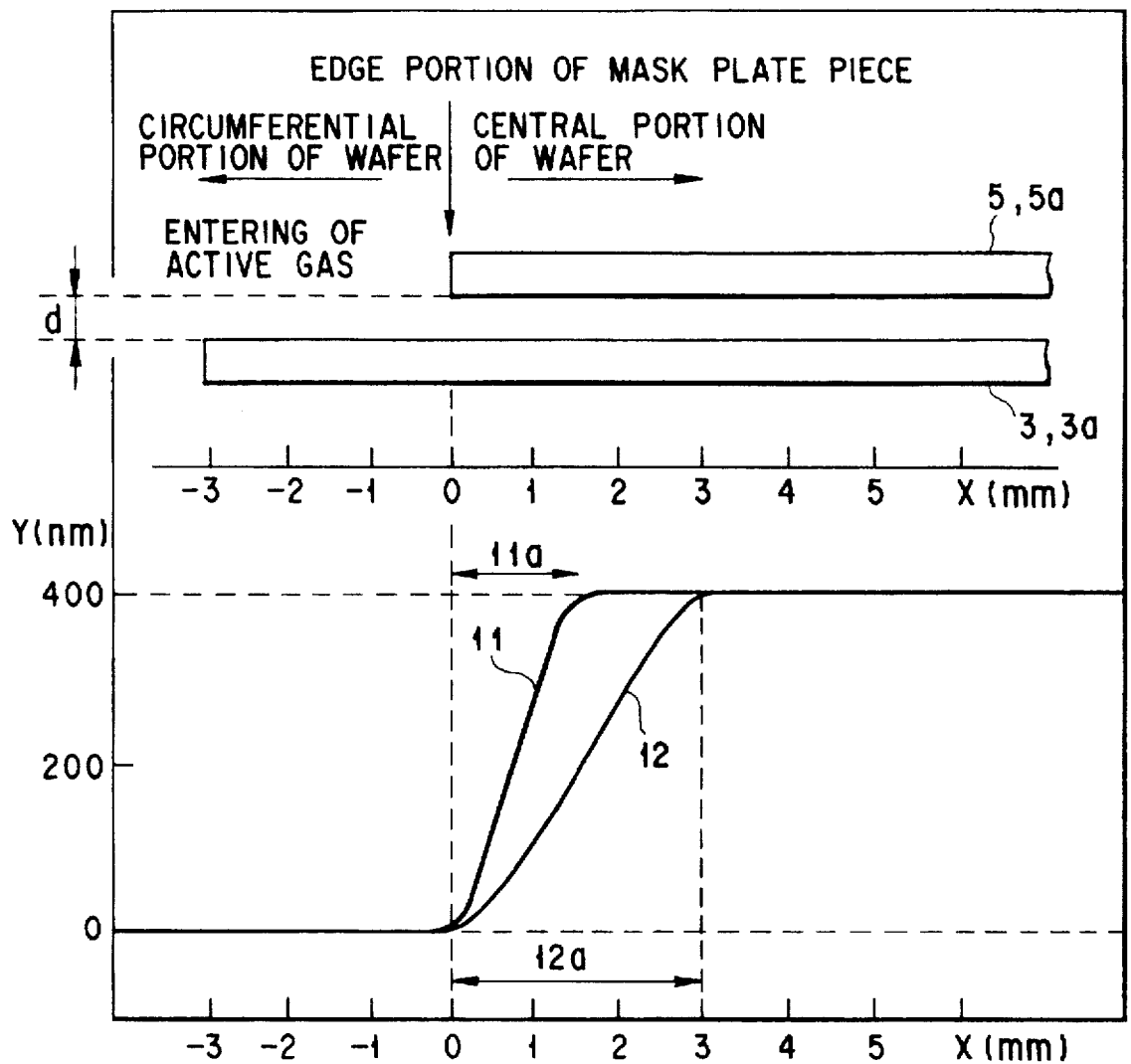
FIG. 2 is an explanatory diagram illustrating that the shape of a pattern side surface portion formed by etching, using the etching apparatus shown in FIG. 1 is different from that of a prior art technique.

FIG. 2 illustrates both of the shape of the pattern side surface portion formed by the etching of the present invention and that of the conventional technique. In this figure, both of the shapes of the pattern side surface portion formed by the etching techniques of the present invention and the prior art are illustrated. Specifically, both of the shapes of the pattern side surface portions are illustrated on the same graph which is defined by a position X (nm) of each of the substrates 3 and 3a in a diameter direction and a position Y (mm) of each of the polycrystal silicon film in the film thickness direction. The polycrystal silicon film which has been etched with the active gas is measured in terms of the thickness of the film in the diameter direction of the substrates 3 and 3a, and the results of the measurement were plotted on this graph. In this case, the position directly underneath the edges of the substrates 3 and 3a with respect to the diameter direction of the substrates 3 and 3a, is set at X=0, whereas the lowest position of the height of the surface of the etched polycrystal silicon film with regard to the thickness direction of the silicon film is set at Y=0. It should be noted that in the outer periphery portions of the substrates 3 and 3a, no remainder of the polycrystal silicon film is found. That is, the region defined by Y<0, is the section of the substrates 3 and 3a.

Reference numeral 11 indicates the shape of the pattern side surface portion formed in the case where the mask plate piece 5 of the present invention is etched, whereas reference numeral 12 indicates the shape of the pattern side surface portion formed in the case where the conventional mask plate piece 5a is etched.

The most ideal shape of the pattern side surface portion formed underneath the edge of a mask plate piece is that made at right angles with the surface of a substrate to be processed. In the case where the etching is carried out with use of the conventional mask plate piece 5a, the pattern side surface portion will have a shape having a slope in the thickness direction, as indicated by reference numeral 12. As indicated by numeral 12, in a region defined by X>3 mm, the polycrystal silicon film is not etched at all, but in a region 12a defined by 0 mm<X<3 mm, the polycrystal silicon film is partially etched. In other words, a desired pattern portion, which should not be removed, is greatly etched.

In the case where the etching is carried out with use of the mask plate piece 5 of the present invention, the pattern side surface portion will have a shape having a slope in the thickness direction, as indicated by reference numeral 11. As indicated by numeral 11, in a region defined by X>1.5 mm, the polycrystal silicon film is not etched at all, but in a region 11a defined by 0 mm<X<1.5 mm, the polycrystal silicon film is partially etched. Thus, the shape of the pattern side surface portion becomes closer to the ideal shape in the case where the mask plate piece 5 of the present invention is used than in the case where the conventional mask plate piece 5a is used.

The following is an explanation of the reason why there appears a difference between the present invention and the prior art in the shape of the pattern side surface formed by etching.

The thermal oxide film formed on the surface of the conventional mask plate piece 5a has a low reactivity with the active gas (that is, active spices containing fluorine elements and the like), as compared to the polycrystal silicon film formed on the substrate 3a. Consequently, the active gas entering from a gap d between the edge portion of the mask plate piece 5a and the substrate 3a does not substantially react with the thermal oxide film on the mask plate piece 5a, but reacts only with the polycrystal silicon film on the substrate 3a. Thus, the active gas which enters the gap, proceeds from the gap d towards the center of the substrate 3a over a long distance, and the pattern side surface portion is formed to have a shape having an inclination in the thickness direction. In other words, the polycrystal silicon film is etched at an excessive degree increasingly from the lower portion (substrate side) of the film towards the upper portion (mask plate piece side).

In contrast, the polycrystal silicon film formed on the surface of the mask plate piece 5 of the present invention has a reactivity with the active gas, substantially the same as that of the polycrystal silicon film on the substrate 3. Therefore, the active gas which enters from the gap d between the edge of the mask plate piece 5 and the substrate 5, reacts with both of the polycrystal silicon film on the substrate 3 and the polycrystal silicon film on the mask plate piece 5, and therefore the consumption (deactivation) rate of the active gas is about twice as much as in the case where the conventional mask plate piece 5a. Consequently, the density of the active gas which entered from the gap quickly decreases as the gas proceeds towards the center portion of the substrate 3, and accordingly the etching rate is quickly lowered. For this reason, the removal of the pattern portion to remain can be suppressed at a minimum level.

As described above, according to the first embodiment, with use of not the photoresist, but the mask plate piece 5 as a mask, the polycrystal silicon film on the substrate 3 is processed, and therefore the number of steps can be reduced. Consequently, the time can be saved and cost can be reduced.

Further, a gap of 10 µm to 100 µm can be provided between the substrate 3 and the mask plate piece 5, the creation of a scratch or dust on the surface of the substrate 3 can be prevented.

Even if a gap of about 10 µm is provided between the substrate 3 and the mask plate piece 5, the active gas enters from the gap. However, a polycrystal silicon film which deactivates the active gas is formed on the surface of the mask plate piece 5, and therefore the erosion of the polycrystal silicon film by the active gas, which proceeds towards the central portion of the substrate 3, can be suppressed. Thus, an excessive etching of the polycrystal silicon film formed into a desired pattern on the substrate 3 can be suppressed. Therefore, a pattern side surface portion having a shape close to what is ideal can be obtained.

The first embodiment is described in connection with the case where the active gas containing excited fluorine elements is used; however the present invention is not limited to this case, but can be applied to an arbitrary type of active gas as long as it contains excited halogen elements.

Further, the description of the first embodiment is directed to the case where the etching is carried out in the state in which the same type of film as the polycrystal silicon film formed on the mask plate piece 5 is formed on the substrate 3; however, the etching may be carried out in the state in which a different type of thin film is formed on the substrate 3. In this case, for example, a silicon nitride film may be used in place of the polycrystal silicon film.

Furthermore, the description of the first embodiment is directed to the case where the etching is carried out in the state in which the same type of film as the polycrystal silicon film formed on the substrate 3 is formed on the mask plate piece 5; however, the etching may be carried out in the state in which a different type of thin film is formed on the mask plate piece 5. In this case, for example, a monocrystal silicon film, a polycrystal silicon film in which phosphor or arsenic is doped, a silicon nitride film, a silicon oxide film or a nickel film may be used in place of the polycrystal silicon film.

Especially, nickel serves as if it is a catalyst, that is, nickel itself is not eroded by the active gas, but deactivates the active gas. Therefore, with use of a nickel film, the problem of erosion does not occur unlike the case where a silicon film or the like is used. Consequently, the work of exchanging the mask plate piece can be omitted, and accordingly the cost can be reduced.

To summarize, with an appropriate combination of types of both of the thin films, in which the deactivation performance of the thin film on the mask plate piece is higher than that of the thin film on the substrate, the object of the present invention can be achieved.

The description of the first embodiment is directed to the case where the circular mask plate piece 5 having a diameter 6 mm smaller than that of the substrate 3; however the mask plate piece may be of a different shape. In this case, a mask plate piece 15 obtained, for example, by forming a silicon substrate on the surface of which a polycrystal silicon film is formed, into a shape shown in FIG. 3, may be used in place of the mask plate piece 5.

Figures 3, 4:
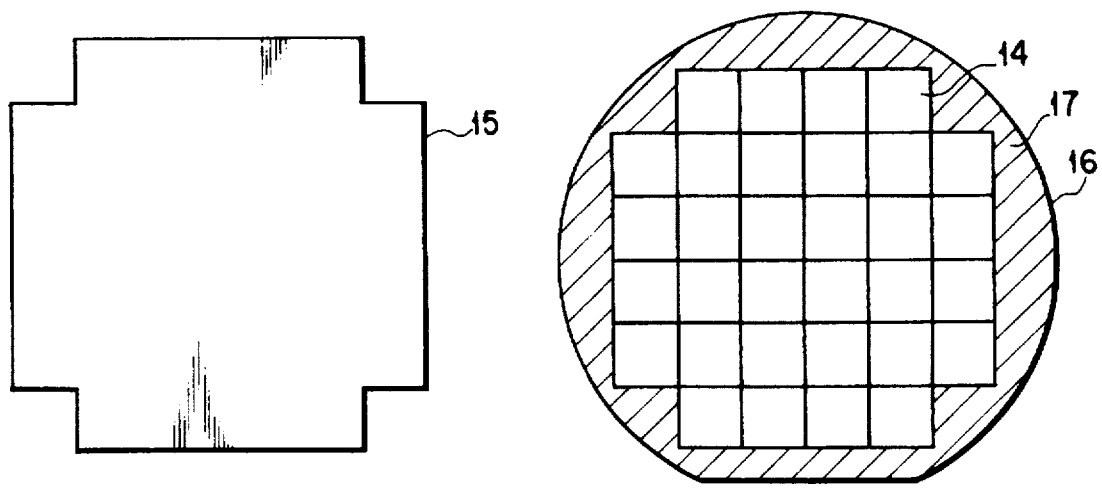
FIG. 3 is a plan view showing a remodeled version of the mask plate piece used in the etching apparatus shown in FIG. 1.
FIG. 4 is a plan view showing a semiconductor substrate serving as a substrate to be processed, used in the etching using the mask plate piece shown in FIG. 3 as a mask.

FIG. 4 is a plan view illustrating a semiconductor substrate serving as a substrate to be processed in the etching operation with use of the mask plate piece 15 shown in FIG. 3, and shows an example of the arrangement of elements formed on the surface of the semiconductor substrate. On the surface of the silicon substrate 16 which is the substrate to be processed, thirty two element regions 14 each having a square shape, are formed. More specifically, the thirty two element regions 14 are arranged on the substrate in a manner of a matrix of six rows by six columns with the four corners missing.

The mask plate piece 15 shown in FIG. 3 has a shape which is larger than the arrangement shape of the thirty two element regions 14 by an external margin of 2 mm at each side. With use of the mask plate piece 15, the polycrystal silicon film formed on the silicon substrate 16 shown in FIG. 4 is etched. Thus, the portion of the polycrystal silicon film in the region 17 other than the thirty two element region 14 on the surface of the silicon substrate 16, is removed.

(Second Embodiment)

FIG. 5 is a diagram showing the structure of an etching apparatus according to the second embodiment of the present invention. In this figure, the same structural members are designated by the same reference numerals, and only the different sections from those of the first embodiment will be discussed.

A heat plate 21 for heating a mask plate piece 5 is provided at an upper section of a supporting rod 4. A fixing rod 6 for fixing the heat plate 21 is provided on the heat plate 21. An electrical current is supplied to the heat plate 21 via the fixing rod 6 so as to be able to heat the portion of the heat plate 21, to which the mask plate piece 5 is mounted.

Next, the etching method according to the second embodiment of the present invention will now be described with reference to FIG. 5. The descriptions of the sections in common with the first embodiment will be omitted.

After a substrate 3 to be processed is placed on the supporting rod 4, the mask plate piece 5 is mounted on the heat plate 21. Then, an electrical current supplied to the heat plate 21 via the fixing rod 6, thereby the portion of the heat plate 21 to which the mask plate piece 5 is amounted is heated. In this case, the temperature of the surface of the mask plate piece 21 is set at, for example, 200° C. After that, the mixture gas is supplied from the gas supply opening 8a into a quartz discharge tube 8. Thus, while heating the surface of the mask plate piece 5 at 200° C. the polycrystal silicon film on the surface of the substrate 3 is etched by the active gas.

During the etching, the active gas which entered from a gap between the edge portion of the mask plate piece 5 and the substrate 3 reacts much more with the polycrystal silicon film on the mask plate piece 5 than with the polycrystal silicon film on the substrate 3. This is because the reactivity of the polycrystal silicon film is rendered about twice as high as that of the silicon film on the substrate 3 when the polycrystal silicon film on the mask plate piece 5 is heated to 200° C. The result of the measurement of the polycrystal silicon film on the substrate after the etching, in terms of thickness, indicates that the portion of the silicon film, located in a region defined by 1.0<X shown in the graph of FIG. 2, was not substantially etched.

More specifically, when the environments are appropriately set so that the reactivity of the polycrystal silicon film on the mask plate piece 5 becomes the same as that of the silicon film on the substrate 3, the active gas which entered a gap between the edge portion of the mask plate piece 5 and the substrate 3, can be made react with the polycrystal silicon film on the mask plate piece 5 with priority. Therefore, according to the second embodiment, the reactivity of the active gas with respect to the polycrystal silicon film on the substrate 3 can be suppressed more than the case of the first embodiment, and therefore the pattern side surface portion having a shape closer to the ideal shape can be realized.

In the second embodiment, the heating means 21 for heating a thin film on the surface of the mask plate piece 5 is provided at an upper portion of the support rod 4; however it is also possible that a cooling device for cooling the thin film on the surface of the mask plate piece 5 is provided on an upper portion of the support rod 4.

(Third Embodiment)

FIG. 6 is a diagram showing the structure of an etching apparatus according to the third embodiment of the present invention. In this figure, the same structural members are designated by the same reference numerals, and only the different sections from those of the first embodiment will be discussed.

In a reaction vessel 1, a susceptor 23 on which a substrate 3 to be processed is placed, is provided. The susceptor 23 has a structure in which the substrate 3, when placed thereon, can be attracted on the susceptor 23 itself by a static force (that is, an electrostatic chuck). Therefore, if the substrate 3 is warped, the warp is straightened. Further, a fixing rod 6 for fixing the mask plate piece 5 is provided at an upper portion of the susceptor 6. The fixing rod 6 can be moved up and down so as to adjust the gap between the mask plate piece 5 and the substrate to 10 μm to 100 μm.

The etching method according to the third embodiment of the present invention will now be described with reference to FIG. 6. The descriptions of the sections in common with the first embodiment will be omitted.

First, the substrate 3 is placed on the susceptor 23. While being placed, the warp of the substrate 3 is straightened by the static chuck. With this straightening, the surface of the substrate 3 is maintained in a flat state to its entirety.

After that the mask plate piece 5 is fixed by the fixing rod 6. As the fixing rod 6 moves up and down, the gap between the mask plate piece 5 and the substrate 3 is adjusted to be 10 μm. A gap of 10 μm is a distance by which, it is considered that the mask plate piece 5 and the substrate 3 can be made as close to each other as possible, without bringing the polycrystal silicon film on the mask plate piece 5 into contact with the polycrystal silicon film on the substrate 3. While maintaining this state, the polycrystal silicon film on the surface of the substrate is etched by the active gas.

As described above, according to the third embodiment, the warp of the substrate 3 is straightened by the static chuck of the susceptor 23, and therefore the surface of the substrate 3 is maintained flat in its entirety. Consequently, the etching can be carried out in the state in which the mask plate piece 5 and the substrate 3 are made as close as about 10 μm. Therefore, the pattern side surface portion can be formed into a shape closer to the ideal one than the case of the first embodiment.

The description of the third embodiment is made in connection with the case where the distance between the mask plate 5 and the substrate 5 is adjusted to be 10 μm by moving the supporting rod 4 up and down; however as long as the polycrystal silicon film on the mask plate piece 5 is not brought into contact with the polycrystal silicon film on the substrate 3, the gap therebetween may be adjusted to be a distance less than 10 μm.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, the present invention can be practiced in combination of the first to third embodiments.

As described, according to the present invention, the density of the active gas which enters as proceeding around the edge portion of the mask plate piece is significantly decreased, the pattern side surface portion formed by the etching can be shaped into what is ideal. Further, the mask plate piece can be situated closer to the substrate to be processed, and therefore the shape of the pattern side surface portion formed by etching can be made closer to the ideal form.

What is claimed is:

1. An etching method comprising: forming a first film on a substrate; forming a second film on a mask plate used as an etch mask for the first film, said second film comprising a material with a deactivation performance higher than that of the first film; fixing the substrate and mask plate so that the first film and second film oppose each other over a distance; and etching the first film by supplying an active gas to the first film; wherein the second film deactivates the active gas.

2. The etching method of claim 1, wherein the etching step comprises supplying the active gas which includes an excited halogen element.

3. The etching method of claim 2, wherein the excited halogen element is fluorine.

4. The etching method of claim 1, wherein the second film comprises monocrystalline Si, polycrystalline Si, polycrystalline Si doped with P or As, silicon nitride, silicon oxide, or nickel.

5. The etching method of claim 1, wherein the first film comprises monocrystalline Si, polycrystalline Si, silicon nitride, or silicon oxide.

6. The etching method of claim 1, further comprising a step of heating the mask plate prior to the etching step, thereby increasing the deactivation performance of the second film.

7. The etching method of claim 1, wherein the fixing step comprises fixing the distance between the mask plate and substrate to range from about 10 μm to about 100 μm.

8. The etching method according to claim 1, wherein the step of forming the second film includes providing the mask plate with a pattern such that the first film is selectively etched when the active gas is supplied.

* * * * *